(12) United States Patent
Masleid et al.

(10) Patent No.: US 7,652,507 B1
(45) Date of Patent: *Jan. 26, 2010

(54) CIRCUITS AND METHODS FOR DETECTING AND ASSISTING WIRE TRANSITIONS

(76) Inventors: Robert Paul Masleid, 17266 Eaton La., Monte Sereno, CA (US) 95930; Andre Kowalczyk, 1951 Ensign Way, San Jose, CA (US) 95133

( * ) Notice: Subject to any disclaimer, the term of this patent is extended or adjusted under 35 U.S.C. 154(b) by 98 days.

This patent is subject to a terminal disclaimer.

(21) Appl. No.: 11/473,608

(22) Filed: Jun. 22, 2006

Related U.S. Application Data

(63) Continuation of application No. 10/879,807, filed on Jun. 28, 2004, now Pat. No. 7,142,018, which is a continuation-in-part of application No. 10/864,271, filed on Jun. 8, 2004, now Pat. No. 7,336,103.

(51) Int. Cl.
*H03K 19/0175* (2006.01)
*H03K 19/094* (2006.01)

(52) U.S. Cl. .............................. 326/86; 326/23; 326/27; 327/112; 327/379

(58) Field of Classification Search .................. 326/83, 326/86, 23, 27; 327/108, 112, 379
See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,700,089 A | 10/1987 | Fujii et al. | |
| 4,739,252 A | 4/1988 | Malaviya et al. | |
| 4,760,279 A | 7/1988 | Saito et al. | |
| 5,039,893 A | 8/1991 | Tomisawa | |
| 5,128,560 A | 7/1992 | Chern et al. | |
| 5,166,555 A | 11/1992 | Kano | |
| 5,227,679 A | 7/1993 | Woo | |
| 5,264,738 A | 11/1993 | Veendrick et al. | |
| 5,297,086 A | 3/1994 | Nasu et al. | |
| 5,410,278 A | 4/1995 | Itoh et al. | |

(Continued)

FOREIGN PATENT DOCUMENTS

EP 1398639 3/2004

(Continued)

OTHER PUBLICATIONS

Iima, et al., Capacitance Coupling Immune, Transient Sensitive Accelerator for Resistive Interconnect Signals of Subquarter Micron ULSI, Apr. 1996, IEEE Journal of Solid-State Circuits, vol. 31, No. 4.

(Continued)

*Primary Examiner*—Daniel D Chang

(57) ABSTRACT

A circuit for assisting signal transitions on a wire, and a method thereof. The circuit includes a first subcircuit that causes a first transistor that is coupled to the circuit's output to turn on during a rising transition and then turn off. The first transistor drives the output to a high state to assist in the rising transition. The circuit also includes a second subcircuit that causes a second transistor that is coupled to the circuit's output to turn on during a falling transition and then turn off. The second transistor drives the output to a low state to assist in the falling transition.

25 Claims, 6 Drawing Sheets

U.S. PATENT DOCUMENTS

| | | | |
|---|---|---|---|
| 5,414,312 A | 5/1995 | Wong |
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski et al. |
| 5,677,650 A | 10/1997 | Kwasniewski et al. |
| 5,680,359 A | 10/1997 | Jeong et al. |
| 5,698,994 A | 12/1997 | Tsuji |
| 5,739,715 A | 4/1998 | Rawson |
| 5,764,110 A | 6/1998 | Ishibashi et al. |
| 5,767,700 A | 6/1998 | Lee |
| 5,777,501 A | 7/1998 | AbouSeido |
| 5,778,214 A | 7/1998 | Taya et al. |
| 5,796,313 A | 8/1998 | Eitan |
| 5,811,983 A | 9/1998 | Lundberg et al. |
| 5,880,608 A | 3/1999 | Mehta et al. |
| 5,963,043 A | 10/1999 | Nassif et al. |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,069,506 A | 5/2000 | Miller, Jr. et al. |
| 6,087,886 A | 7/2000 | Ko |
| 6,114,840 A * | 9/2000 | Farrell et al. ............ 327/374 |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 | 1/2001 | Ishii |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Choe et al. |
| 6,275,091 B1 | 8/2001 | Saeki |
| 6,281,706 B1 | 8/2001 | Wert et al. |
| 6,285,230 B1 | 9/2001 | Na |
| 6,321,282 B1 | 11/2001 | Horowitz et al. |
| 6,407,571 B1 | 6/2002 | Furuya et al. |
| 6,426,641 B1 | 7/2002 | Koch et al. |
| 6,455,901 B2 | 9/2002 | Kameyama et al. |
| 6,459,319 B2 | 10/2002 | Sako |
| 6,476,632 B1 | 11/2002 | La Rosa et al. |
| 6,489,796 B2 | 12/2002 | Tomishima |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,966 B1 | 7/2004 | La Rosa et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,271,638 B2 | 9/2007 | Takai et al. |
| 7,295,041 B1 | 11/2007 | Masleid et al. |
| 7,304,503 B2 | 12/2007 | Masleid et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0042960 A1 | 3/2003 | Gomm |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

FOREIGN PATENT DOCUMENTS

| | | |
|---|---|---|
| JP | 03089624 | 4/1991 |
| JP | 04091516 | 3/1992 |
| JP | 065216723 A | 5/1994 |

OTHER PUBLICATIONS

Nalamalpu, et al., Boosters for Driving Long Onchip Interconnects-Design Issues, Interconnect Synthesis, and Comparison With Repeaters, Jan. 2002, IEEE Transactions on Computer-Aided Design of Integrated Circuits and Systems, vol. 21, No. 1.

Non-Final OA Dated Sep. 20, 2005; U.S. Appl. No. 10/879,879.

Notice of Allowance Dated Mar. 22, 2006; U.S. Appl. No. 10/879,879.

Notice of Allowance Dated Jul. 18, 2006; U.S. Appl. No. 10/879,879.

Non-Final OA Dated Sep. 20, 2005; U.S. Appl. No. 10/879,807.

Notice of Allowance Dated Mar. 15, 2006; U.S. Appl. No. 10/879,807.

Notice of Allowance Dated May 19, 2006; U.S. Appl. No. 10/879,807.

Non-Final OA Dated Mar. 15, 2005; U.S. Appl. No. 10/879,654.

Notice of Allowance Dated Jul. 6, 2005; U.S. Appl. No. 10/879,654.

Final OA Dated May 12, 2006; U.S. Appl. No. 10/864,271.

Final OA Dated May 24, 2007; U.S. Appl. No. 10/864,271.

Non-Final OA Dated Aug. 24, 2005; U.S. Appl. No. 10864271; Tran-P326.

Final OA Dated Oct. 24, 2006; U.S. Appl. No. 10/864,271.

Notice of Allowance Dated Oct. 29, 2007; U.S. Appl. No. 10/864,271.

Restriction Requirement Dated Mar. 6, 2006; U.S. Appl. No. 10/864,271.

Final OA Dated Jan. 25, 2008; U.S. Appl. No. 11/703,323.

Non-Final OA Dated May 14, 2008; U.S. Appl. No. 11/703,323.

Non-Final OA Dated Jul. 26, 2007; U.S. Appl. No. 11/703,323.

Notice of Allowance Dated Jan. 27, 2009; U.S. Appl. No. 11/703,323.

Notice of Allowance Dated Sep. 23, 2008; U.S. Appl. No. 11/703,323.

Final OA Dated Jun. 4, 2008; U.S. Appl. No. 11/999,293.

Non-Final OA Dated Apr. 17, 2008; U.S. Appl. No. 11/999,293.
Notice of Allowance Dated Jan. 27, 2009; U.S. Appl. No. 11/999,293.
Notice of Allowance Dated Jul. 18, 2008; U.S. Appl. No. 11/999,293.
Notice of Allowance Dated Aug. 11, 2008; U.S. Appl. No. 11/999,293.
Notice of Allowance Dated Oct. 8, 2008; U.S. Appl. No. 11/999,293.
Chen, G, et al., "DynamicNBTI of p-MOS Transitors and its Impact on MOSFET Scaling" IEEE Electron Device Letters, 2002.
Oner et al., "A compact Monitoring Circuit for Real-Time On-Chip Diagnosis of Hot-Carrier Induced Degradation" Microelectronic test structures. Proceedings, IEEE International Conference in Monterey, CA. Mar. 17, 1997- Mar. 20, 1997, pp. 72-76.
Peters, Laura. "NBTI: A Growing Threat to Device Reliability," Semiconductor International. Mar. 1, 2004. Http://www.reed-electronics. com/semiconductor/article/CA386329?industryid=3033.

Reddy. V. et all, "Impact of Negative Bias Temperature Instability on Digital Circuit Reliability". 2002 IEE International Reliability Physics Symposium Proceedings, Dallas, TX, Apr. 7, 2002- Apr. 11, 2002.
Final Office Action; Mail Date Jun. 26, 2009; U.S. Appl. No. 12/033,712.
Non Final Office Action; Mail Date Jan. 16, 2009; U.S. Appl. No. 12/033,712.
Non Final Office Action; Mail Date Jul. 29, 2008; U.S. Appl. No. 12/033,712.
Non Final Office Action; Mail Date Jun. 10, 2009; Application No. 12/124,136.
Non Final Office Action; Mail Date Sep. 15, 2009; U.S. Appl. No. 12/037,884.

* cited by examiner

CIRCUITS AND METHODS FOR DETECTING AND ASSISTING WIRE TRANSITIONS

RELATED UNITED STATES PATENT APPLICATIONS

This application is a Continuation application of the commonly-owned U.S. patent application with Ser. No. 10/879,807, filed Jun. 28, 2004, by R. Masleid et al., and entitled "Circuits and Methods for Detecting and Assisting Wire Transitions," now U.S. Pat. No. 7,142,018, which is a Continuation-in-Part of U.S. patent application Ser. No. 10/864,271 by R. Masleid et al., filed on Jun. 8, 2004, now U.S. Pat. No. 7,336,103 entitled "Stacked Inverter Delay Chain," assigned to the assignee of the present invention, and hereby incorporated by reference in its entirety.

This application is related to U.S. patent application Ser. No. 10/879,808 by R. Masleid et al., filed on Jun. 28, 2004, entitled "Repeater Circuit Having Different Operating and Reset Voltage Ranges, and Methods Thereof," now U.S. Pat. No. 7,173,455, assigned to the assignee of the present invention, and hereby incorporated by reference in its entirety.

This application is related to U.S. patent application Ser. No. 10/879,879 by R. Masleid et al., filed on Jun. 28, 2004, entitled "Repeater Circuit with High Performance Repeater Mode and Normal Repeater Mode," now U.S. Pat. No. 7,119,580, assigned to the assignee of the present invention, and hereby incorporated by reference in its entirety.

This application is related to U.S. patent application Ser. No. 10/879,645 by R. Masleid et al., filed on Jun. 28, 2004, entitled "Repeater Circuit with High Performance Repeater Mode and Normal Repeater Mode, Wherein High Performance Repeater Mode Has Fast Reset Capability," now U.S. Pat. No. 7,304,503, assigned to the assignee of the present invention, and hereby incorporated by reference in its entirety.

BACKGROUND OF THE INVENTION

1. Field of the Invention

Embodiments of the present invention relate to wire repeaters, and in particular to wire accelerators.

2. Related Art

A vital area of circuit performance is the propagation time of signals across a chip. Longer wires in chips resist the propagation of signals due to the resistance and capacitance of the wire. The propagation of signals across a chip can be improved by inserting an amplification circuit—sometimes referred to as buffering or repeater insertion—into the wire.

A wire accelerator is a type of wire repeater. A wire accelerator is intended to detect a transition in a wire and then help the transition. A problem with conventional wire accelerators is that, after helping achieve one transition, they continue to drive the wire and so resist the next transition.

SUMMARY OF THE INVENTION

Therefore, a wire accelerator that can both drive a wire and assist during wire transitions, without resisting the transitions, would be valuable. Embodiments in accordance with the present invention provide such a wire accelerator.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Figure 1:
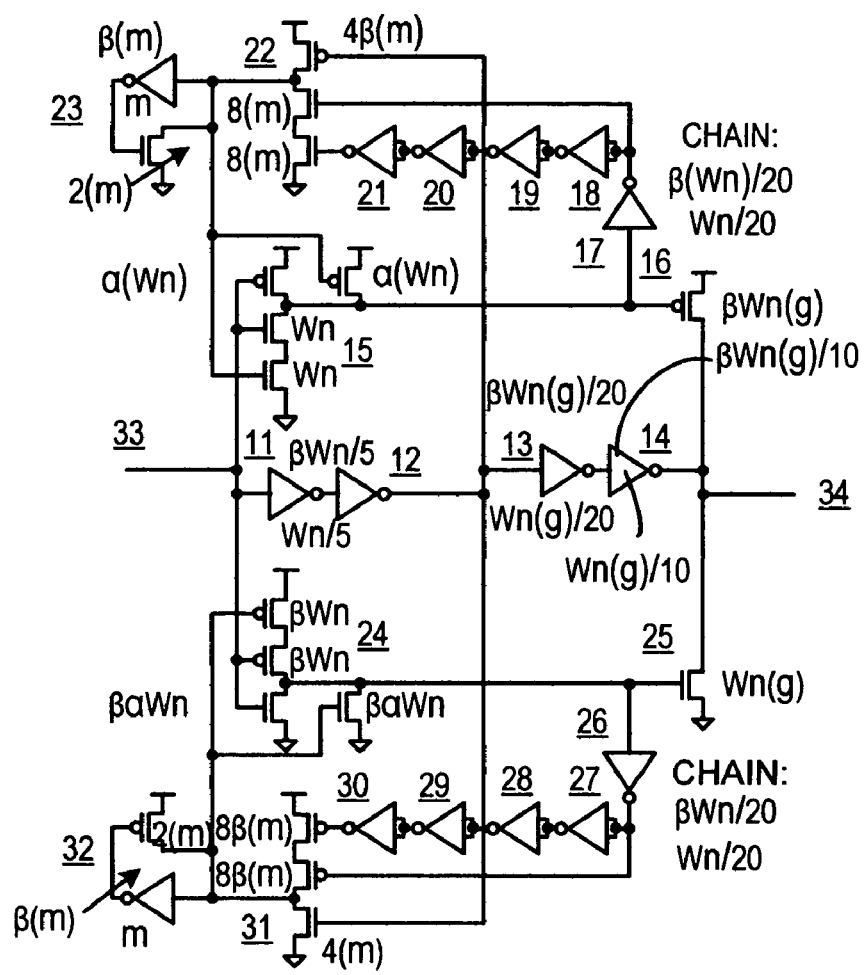
FIG. 1 illustrates a schematic of one embodiment of a circuit for assisting signal transitions in accordance with the present invention.

FIG. 1 illustrates a schematic of one embodiment of a circuit 10 for driving signals on a wire and for assisting signal transitions in accordance with the present invention. Circuit 10 can be coupled to the wire to function as a wire repeater or accelerator. As will be seen, circuit 10 provides the capability to detect a transition (e.g., a rising transition or falling transition) occurring on the wire and assist the transition, and then drive the wire after the transition without resisting a subsequent transition.

In the embodiment of FIG. 1, circuit 10 has an input node 33 and an output node 34 that are each coupled to the wire (specifically, a first part of the wire is connected to input node 33, and a second part of the wire is connected at output node 34). In an alternative embodiment, circuit 10 can be implemented in a lookaside configuration, in which the input node is connected to the output node, and together the input and output nodes are connected to the wire. Lookaside configurations are illustrated as circuits 35 and 36 in FIGS. 2 and 3, respectively.

In general, circuit 10 of FIG. 1 includes three subcircuits referred to herein as keeper circuitry, rising transition circuitry, and falling transition circuitry. In the example of FIG.

1, the keeper circuitry includes a delay chain consisting of gates (inverters) 11, 12, 13 and 14 coupled between the input node 33 and the output node 34.

In the present embodiment, the rising transition circuitry includes NAND gate 15, a delay chain consisting of inverter 17 and stacked inverters 18, 19, 20 and 21 (stacked inverters are described further in conjunction with FIG. 4 below); pseudo-inverter 22; and half latch 23. The rising detection circuitry drives an output transistor 16. In one embodiment, transistor 16 is a p-type device (e.g., a positive channel metal oxide semiconductor field effect transistor, or pFET).

Continuing with reference to FIG. 1, the falling transition circuitry includes NOR gate 24; a delay chain consisting of inverter 26 and stacked inverters 27, 28, 29 and 30; pseudo-inverter 31; and half latch 32. The falling detection circuitry drives an output transistor 25. In one embodiment, transistor 25 is an n-type device (e.g., a negative channel metal oxide semiconductor field effect transistor, or nFET).

Circuit 10 will be described in operation. From that discussion, it will be understood that the keeper circuitry, rising transition circuitry and falling transition circuitry are not limited to the elements illustrated and described by the example of FIG. 1. For example, half latches 23 and 32 can be replaced with full latches. Also, for example, the number of inverters in the delay chains can be different than that shown in the example of FIG. 1.

In general, the rising transition circuitry generates a pulse in response to receiving a rising input at input node 33 (in other words, upon detecting a rising transition, e.g., a rising edge, in a signal on a wire). The pulse operates the output transistor 16 for a period of time. Afterwards, the transistor 16 is shut off. While turned on, the transistor 16 drives the output node 34 to a high state.

In a similar manner, the falling transition circuitry generates a pulse in response to receiving a falling input at input node 33 (in other words, upon detecting a falling transition, e.g., a falling edge, in a signal on a wire). The pulse operates the output transistor 25 for a period of time. Afterwards, the transistor 25 is shut off. While turned on, the transistor 25 drives the output node 34 to a low state.

The keeper circuitry operates at a reduced drive strength relative to the rising and falling transition circuitry. The keeper circuitry maintains the state at the output node 34 in between operation of the transistors 16 and 25. That is, the keeper circuitry maintains a high state at output node 34 after transistor 16 is shut off (and before transistor 25 is turned on), and also maintains a low state at output node 34 after transistor 25 is turned off (and before transistor 16 is turned on).

More specifically, circuit 10 operates as follows. A rising input (a rising edge) at input node 33 causes the NAND gate 15 to fall, which activates the output transistor 16 and drives the output node 34 high. The fall of the NAND gate 15 also starts the delay chain in the rising transition circuitry (inverter 17, stacked inverters 18-21 and pseudo-inverter 22). The delay chain in the keeper circuitry (specifically, inverters 11-12) rises, drives half latch 32 low, and resets the falling transition circuitry. The NAND gate 15 then rises (after a period of time established by the delay chain in the rising transition circuitry), which deactivates the transistor 16. The rise of NAND gate 15 also releases half latch 23 so that it can be reset during a falling transition. After transistor 16 is shut off, the keeper circuitry keeps output node 34 high, until a falling transition is detected.

A falling input (a falling edge) at input node 33 causes the NOR gate 24 to rise, which activates the output transistor 25 and drives the output node 34 low. The rise of the NOR gate 24 also starts the delay chain in the falling transition circuitry (inverter 26, stacked inverters 27-30 and pseudo-inverter 31). The delay chain in the keeper circuitry (specifically, inverters 11-12) falls, drives half latch 23 high, and resets the rising transition circuitry. The NOR gate 24 then falls (after a period of time established by the delay chain in the falling transition circuitry), which deactivates the transistor 25. The fall of NOR gate 24 also releases half latch 32 so that it can be reset during a rising transition. After transistor 25 is shut off, the keeper circuitry keeps output node 34 low, until a rising transition is detected.

Thus, circuit 10 provides complementary edge detectors: the NAND gate and delay chain of the rising transition circuitry, and the NOR gate and delay chain of the falling transition circuitry. The rising transition resets the falling transition circuitry, and the falling transition resets the rising transition circuitry, while the keeper circuitry in effect acts as memory to retain the current state of the overall circuit.

Circuit 10 is in effect a four-state driver: 1) at a rising transition, an internal pulse is generated and the state is driven high with a low impedance output transistor ("hard drive high"), assisting the rising transition; 2) followed by a higher impedance keep state which maintains the high state and helps drive the high signal on the wire; 3) followed by the state being driven low with a low impedance output transistor ("hard drive low"), assisting the falling transition; and 4) followed by another higher impedance keep state that maintains the low state and helps drive the low signal on the wire.

In FIG. 1, 'Wn' refers to the depletion layer width, and 'm' refers to the minimum device size (width). Different values of Wn are contemplated, and device widths are generally proportional to Wn. If a value of Wn results in a device width less than the minimum, the device width is clamped at the minimum. In the stacked inverters 18-21 and 27-30, there may be both p-type devices and n-type devices (see FIG. 4); hence, in FIG. 1, two sets of dimensions are shown for the elements of the delay chains (one for p-type devices, and one for n-type devices).

In one embodiment, the gate width-to-length ratio ($\beta$) is 1.7 (the basic strength ratio of P to N), the scaling factor ($\alpha$) is 1/6 (the beta skew factor for skewed stages), and the transconductance (g) is 8 (the gain ratio between internal stages). Such values are exemplary; the present invention is not so limited.

However, and importantly, dimensions are selected so that the keeper circuitry does not interfere with a transition. That is, the keeper circuitry can maintain the state at the output node 34, but is weak enough so that it can be overcome by a wire transition. The transistors 16 and 25 are turned off between transitions, so the rising transition circuitry and falling transition circuitry also do not interfere with a transition.

Figure 2:
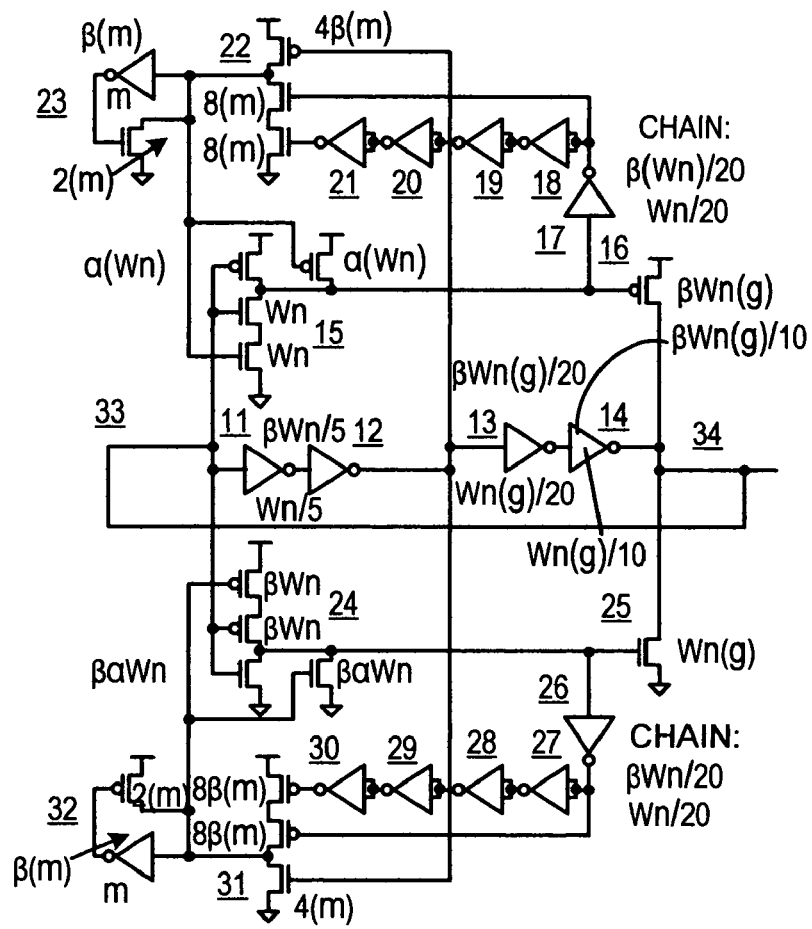
FIG. 2 illustrates a schematic of another embodiment of a circuit for assisting signal transitions in accordance with the present invention.

FIG. 2 illustrates a schematic of an embodiment of a circuit 35 for driving wire signals and assisting signal transitions in accordance with the present invention. Circuit 35 differs from circuit 10 of FIG. 1 in that the input node 33 and output node 34 of circuit 35 are connected to each other in a lookaside configuration. Elements common to circuits 10 and 35 are numbered the same. Circuit 36 can be implemented as a lookaside wire repeater or accelerator when coupled to a wire on a chip, functioning in a manner similar to circuit 10.

Figure 3:
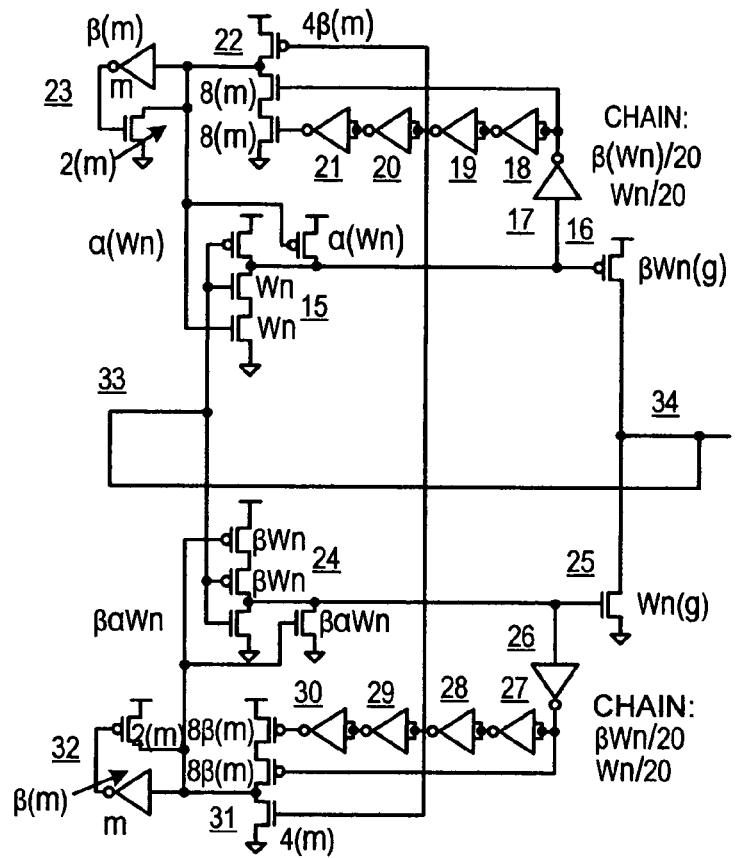
FIG. 3 illustrates a schematic of yet another embodiment of a circuit for assisting signal transitions in accordance with the present invention.

FIG. 3 illustrates a schematic of an embodiment of a circuit 36 for assisting signal transitions in accordance with the present invention. Circuit 36 differs from circuit 35 of FIG. 2 in that circuit 36 does not include keeper circuitry (e.g., inverters 11-14 of circuit 35 are not present in circuit 36). Elements common to circuits 35 and 36 are numbered the same. Circuit 36 can be implemented as a lookaside wire repeater when coupled to a wire on a chip, functioning in a manner similar to circuit 35 except for maintaining state at the output node between rising and falling transitions. In a similar manner, the keeper circuitry may not be included in circuit 10 of FIG. 1.

Figure 4:
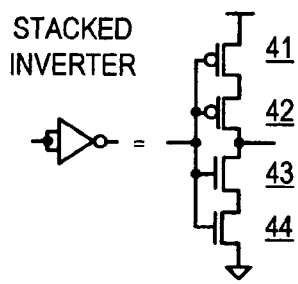
FIG. 4 illustrates a schematic of one embodiment of a stacked inverter in accordance with the present invention.

FIG. 4 illustrates a schematic of one embodiment of a stacked inverter 40 in accordance with the present invention. In contrast to a conventional inverter, stacked inverter 40 includes more than a single p-type device coupled to a single n-type device. Rather, stacked inverter 40 includes multiple p-type devices and multiple n-type devices. In the example of FIG. 4, stacked inverter 40 includes two p-type devices 41 and 42, and two n-type devices 43 and 44; however, the present invention is not limited to either that combination of devices or that number of devices. The gates of the p-type and n-type devices are coupled to form the input of stacked inverter 40.

The p-type devices are configured to pull the output high (when appropriate) and the n-type devices are configured to pull the output low. Consequently, the drive capability of stacked inverter 40 is less than the drive capability of a conventional inverter. Beneficially, such decreased drive capability produces an increased delay of a signal through stacked inverter 40. Additionally, stacked inverter 40 presents an increased load to its driving circuitry in comparison to a conventional inverter. For example, a signal input to stacked inverter 40 is coupled to four active devices as opposed to being coupled to two active devices in a conventional inverter. Each device presents an input capacitance. Such increased loading produces a further desirable increase in signal propagation delay.

The output of stacked inverter 40 can be coupled to the input of another stacked inverter, as in the circuits of FIGS. 1-3, to achieve larger signal delay values. In the example of FIG. 4, the output is taken at the coupling of a p-type device to an n-type device.

Figure 5:
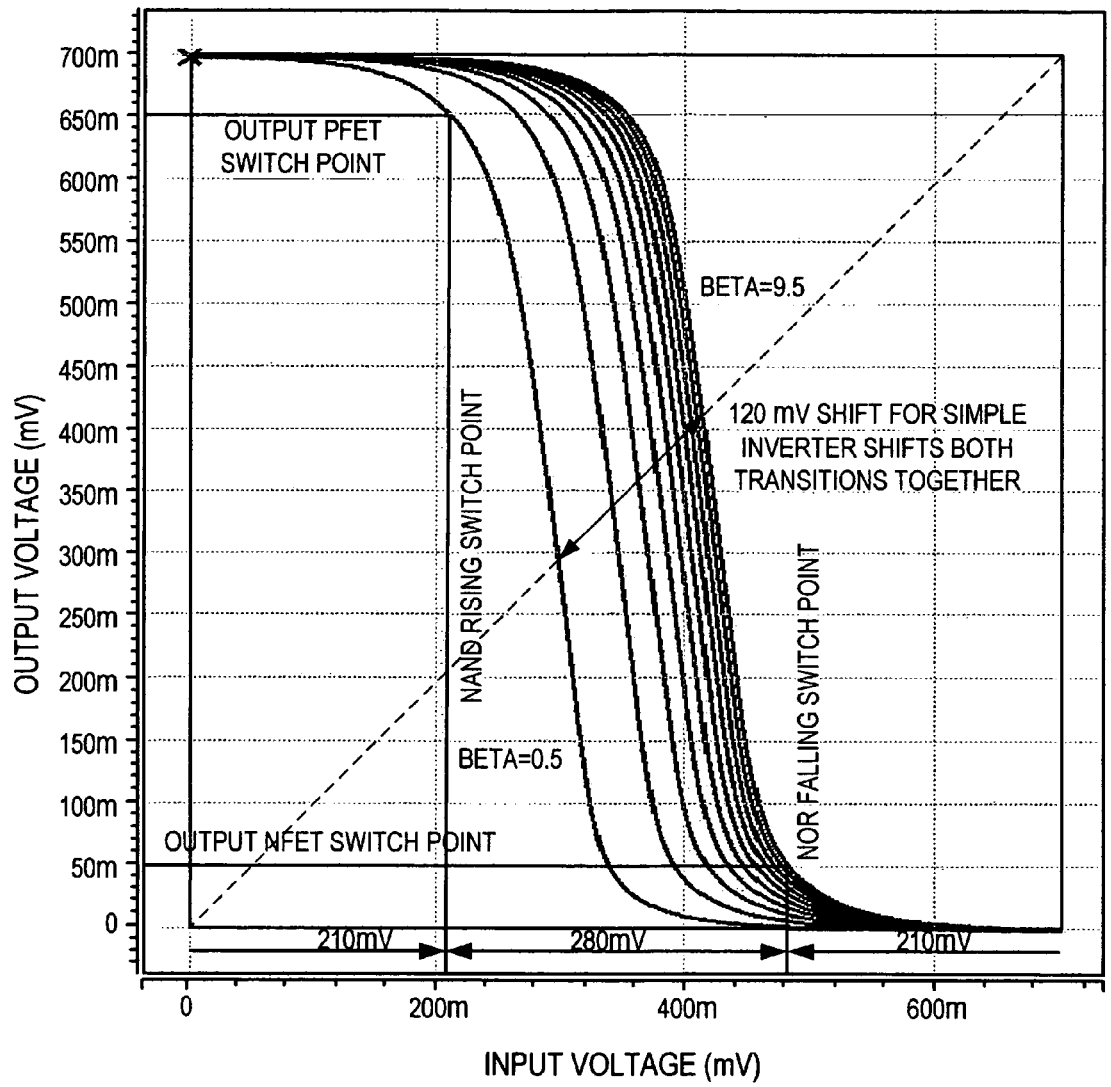
FIG. 5 is a curve of inverter voltage in versus voltage out in accordance with embodiments of the present invention.

FIG. 5 is an exemplary inverter transfer curve for a 700 millivolt (mV) power supply (Vdd) showing voltage in versus voltage out for various values of $\beta$ in accordance with embodiments of the present invention. FIG. 5 illustrates that, for small voltage shifts on the input, there is no response on the output until the mid-range of the voltage is reached, at which point a relatively large shift is realized. Ordinarily, for static circuits, the input switch point is defined as the point where the input voltage equals the output voltage, so that the switching point shifts only a little as a function of $\beta$. However, referring also to FIGS. 1-3, the NAND gate 15 and the NOR gate 24 are only driving individual transistors (transistors 16 and 25, respectively), and therefore it is not necessary for the output voltages of the logic gates 15 and 24 to reach their respective input voltages in order for circuits 10, 35 or 36 to function. Instead, the logic gates 15 and 24 only need to drive to the switch points (the threshold voltages) of the respective output transistors 16 and 25.

Looking at FIG. 5, with reference also to FIGS. 1-3, the output pFET switch point (e.g., transistor 16) is approximately 50 mV below Vdd. For the curve of $\beta$ equal to 0.5, this reduces the rising switch point of the NAND gate 15 by about 140 mV from Vdd/2, to about 210 mV. The output nFET switch point (e.g., transistor 25) and the falling switch point of the NOR gate 24 are affected in a similar manner with $\beta$ equal to 9.5.

Thus, for an output pFET, the input voltage switch point moves approximately 140 mV in the advantageous direction (that is, down) from Vdd/2 for a 700 mV power supply. Similarly, for an output nFET, the input voltage switch point moves approximately 140 mV up from Vdd/2 for a 700 mV power supply. Consequently, the input switching point is approximately one-third and two-thirds of Vdd for a pFET output and an nFET output, respectively. Thus, the switch points are advantageously moved a relatively far distance apart from each other. Another advantage is that a reduced portion of a transition (rising or falling) is required in order for circuits 10, 35 and 36 (FIGS. 1-3) to operate. That is, the logic gates 15 and 24 will operate at lower voltages, and so the circuits 10, 35 and 36 will detect a transition earlier and thus can assist the transition earlier.

To summarize, with any of the circuits 10, 35 and 36 of FIGS. 1-3 connected to a wire that is propagating a signal, as the signal begins to transition, the circuit does not fight the transition because its main outputs (transistors 16 and 25) are in a high impedance state (they are shut down). Once the input switch point is reached (at either NAND gate 15 or NOR gate 24, depending on whether there is a rising or a falling transition), the appropriate output transistor (transistor 16 or 25, respectively) is turned on to assist the transition, and then turned off again. Circuits 10 and 35 maintain the current output state (high or low) to continue to help drive the wire.

Figure 6:
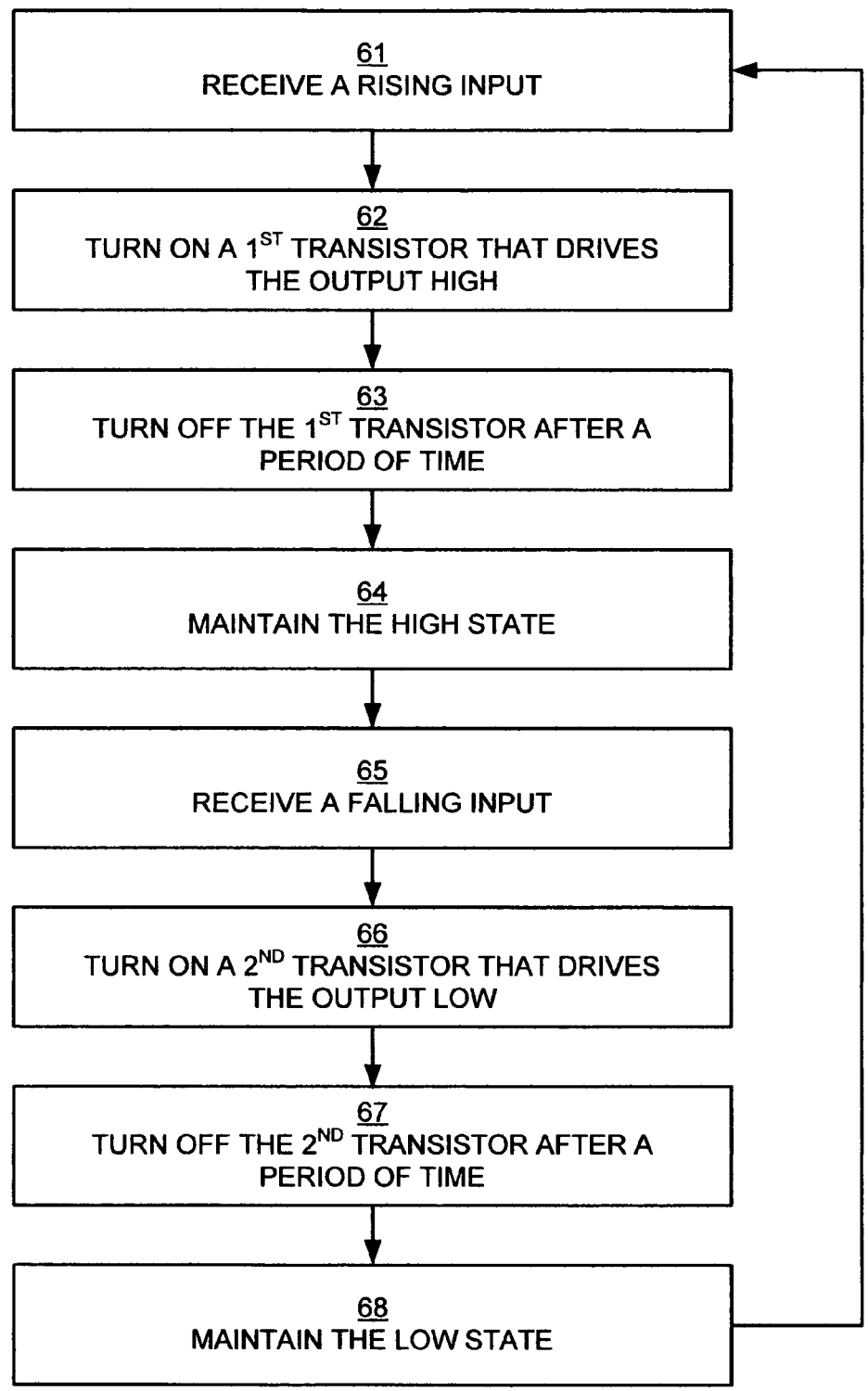
FIG. 6 is a flowchart of a method for assisting signal transitions in accordance with one embodiment of the present invention.

FIG. 6 is a flowchart 60 of a method for assisting signal transitions in accordance with one embodiment of the present invention. Although specific steps are disclosed in flowchart 60, such steps are exemplary. That is, embodiments of the present invention are well-suited to performing various other steps or variations of the steps recited in flowchart 60. It is appreciated that the steps in flowchart 60 may be performed in an order different than presented, and that not all of the steps in flowchart 60 may be performed.

In step 61 of FIG. 6, with reference also to FIGS. 1-3, a rising input is received at a circuit (e.g., circuits 10, 35 or 36). The rising input indicates that a signal on a wire coupled to the circuit is undergoing a rising transition. In one embodiment, the rising input is detected by an edge detector consisting of, at least in part, a logical gate (e.g., NAND gate 15).

In step 62, the rising input causes a first transistor (e.g., transistor 16) to turn on and drive the circuit output high. The circuit output, coupled to the wire, assists the wire signal's rising transition.

In step 63, the first transistor is turned off after a period of time. In one embodiment, the period of time is established by a delay chain coupled to the first transistor. With the first transistor turned off, the circuit will not resist a subsequent (e.g., falling) transition.

In step 64, in one embodiment, after the first transistor is turned off, the high output state is maintained by a keeper circuit. With the output connected to the wire, maintaining the high output state helps to drive the wire signal (which is also high). However, the keeper circuit is relatively weak and so also will not resist a subsequent transition.

In step 65, a falling input is received at the circuit. The falling input indicates that a signal on the wire coupled to the circuit is undergoing a falling transition. In one embodiment, the falling input is detected by an edge detector consisting of, at least in part, a logical gate (e.g., NOR gate 24).

In step 66, the falling input causes a second transistor (e.g., transistor 25) to turn on and drive the circuit output low. The circuit output, coupled to the wire, assists the wire signal's falling transition.

In step 67, the second transistor is turned off after a period of time. In one embodiment, the period of time is established by a delay chain coupled to the second transistor. With the second transistor turned off, the circuit will not resist a subsequent (e.g., rising) transition.

In step 68, in one embodiment, after the second transistor is turned off, the low output state is maintained by the keeper circuit. With the output connected to the wire, maintaining the low output state helps to drive the wire signal (which is also low). However, as mentioned above, the keeper circuit is relatively weak and so also will not resist a subsequent transition.

Figure 7:
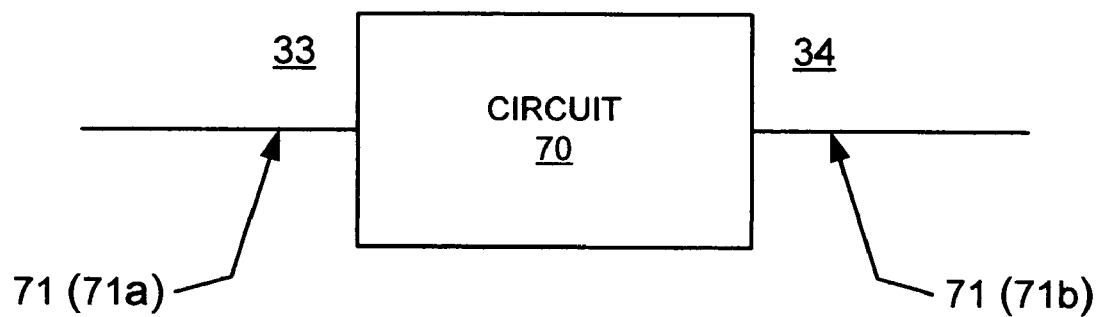
FIG. 7 is a block diagram illustrating a circuit coupled to a wire according to one embodiment of the present invention.

FIG. 7 illustrates a circuit 70 such as circuit 10, 35 or 36 of FIGS. 1-3, respectively, coupled to a wire 71 in a "feed through" fashion according to one embodiment of the present invention. In the example of FIG. 7, the wire 71 actually consists of a first portion (71a) and a second portion (71b). A signal on wire 71 enters circuit 70 at input 33 and exits at output 34. According to embodiments of the present invention, circuit 70 acts as a wire repeater/accelerator to assist a rising or falling signal transition on the wire 71, as described above. In various embodiments, a signal on the wire 71 is also driven by the circuit 70 as described above.

Figure 8:
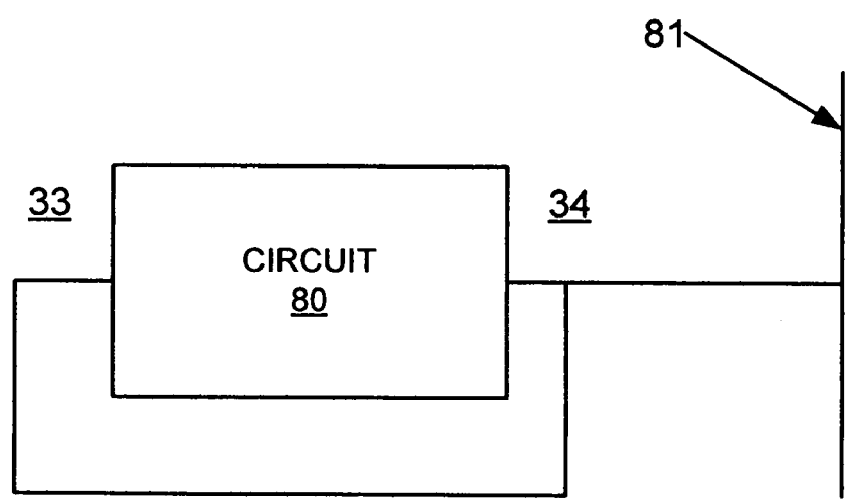
FIG. 8 is a block diagram illustrating a circuit coupled to a wire according to another embodiment of the present invention.

FIG. 8 illustrates a circuit 80 such as circuits 10, 35 or 36 of FIGS. 1-3, respectively, coupled to a wire 81 in a "lookaside" fashion according to one embodiment of the present invention. A signal on wire 81 enters circuit 80 at input 33 and exits at output 34. According to embodiments of the present invention, circuit 80 acts as a wire repeater/accelerator to assist a rising or falling signal transition on the wire 81, as described above. In various embodiments, a signal on the wire 81 is also driven by the circuit 80 as described above.

In summary, embodiments of the present invention provide circuits (e.g., wire accelerators and repeaters), and methods thereof, for assisting signal transitions on a wire (such as a wire on a chip). Circuit embodiments in accordance with the present invention can both drive a signal on the wire and assist during wire transitions, without resisting the transitions.

Embodiments in accordance with the present invention are thus described. While the present invention has been described in particular embodiments, it should be appreciated that the present invention should not be construed as limited by such embodiments, but rather construed according to the below claims.

What is claimed is:

1. A device comprising:
   a wire for propagating a signal;
   a circuit coupled to the wire, the circuit having an input and an output, the circuit causing a first transistor to turn on and then turn off, the first transistor driving the output to a first state in response to the circuit detecting a first transition in the signal, the circuit comprising a delay chain coupled between the input and the output and operable for maintaining the first state at the output with the first transistor turned off until a second transition is detected in the signal, wherein in response to the circuit detecting the second transition the circuit causes a second transistor that is coupled to the output to turn on and then turn off, the second transistor driving the output to a second state, and the circuit maintaining the second state at the output with the second transistor turned off until a third transition is detected in the signal;
   the circuit further comprising first circuitry coupled to the input, the first circuitry causing the second transistor to turn on during the second transition and then turn off after a first period of time, the second transistor driving the output to the second state to assist in the second transition.

2. The device of claim 1 wherein the circuit further comprises second circuitry coupled to the input, the second circuitry causing the first transistor that is coupled to the output to turn on during the first transition and then turn off after a second period of time, the first transistor driving the output to the first state to assist in the first transition.

3. The device of claim 1 wherein the first transition is a rising transition, the first state is a high state, and the second transition is a falling transition.

4. The device of claim 1 wherein the first transition is a falling transition, the first state is a low state, and the second transition is a rising transition.

5. The device of claim 1 wherein the first circuitry comprises:
   a NOR gate coupled to the wire; and
   a delay chain coupled to the NOR gate.

6. The device of claim 1 wherein the first circuitry comprises:
   a NAND gate coupled to the wire; and
   a delay chain coupled to the NAND gate.

7. The device of claim 1 wherein the first transistor is a p-type device and the second transistor is an n-type device.

8. The device of claim 1 wherein the first transistor is an n-type device and the second transistor is a p-type device.

9. The device of claim 1 wherein the circuit comprises a plurality of gates for maintaining the first state at the output with the first transistor turned off and for maintaining the second state at the output with the second transistor turned off.

10. The device of claim 1 wherein the input is connected to the output and wherein the input and output are coupled to the wire in a lookaside configuration.

11. The device of claim 1 wherein the input and the output are coupled to the wire in a feed-through configuration.

12. A circuit for assisting signal transitions on a wire, the circuit comprising:
   first circuitry coupled to the wire, wherein the first circuitry causes a first transistor to turn on in response to a rising transition of a signal on the wire and then turn off after a first period of time, wherein the first transistor drives an output of the circuit to a high state to assist in the rising transition;
   second circuitry coupled to the wire, wherein the second circuitry causes a second transistor to turn on in response to a falling transition of a signal on the wire and then turn off after a second period of time, wherein the second transistor drives the output to a low state to assist in the falling transition; and
   third circuitry coupled to the wire and comprising a delay chain, wherein the third circuitry maintains the high state at the output from the rising transition until the falling transition after the first transistor turns off, wherein the third circuitry also maintains the low state from the falling transition until a next rising transition after the second transistor turns off, and wherein the delay chain resets the second circuitry between the rising transition and the falling transition and also resets the first circuitry between the falling transition and the next rising transition.

13. The circuit of claim 12 wherein an input of the circuit is connected to the output and wherein the input and output are coupled to the wire in a lookaside configuration.

14. The circuit of claim 12 wherein an input of the input of the circuit and the output are coupled to the wire in a feed-through configuration.

15. The circuit of claim 12 wherein the first circuitry comprises:
   a NAND gate coupled to the wire; and
   a delay chain coupled to the NAND gate.

16. The circuit of claim 12 wherein the first transistor is a p-type device.

17. The circuit of claim 12 wherein the second circuitry comprises:

a NOR gate coupled to the wire; and a delay chain coupled to the NOR gate.

18. The circuit of claim 12 wherein the second transistor is an n-type device.

19. A circuit for assisting signal transitions on a wire, the circuit comprising:

first circuitry coupled to an input and an output on the wire, wherein the first circuitry causes a first transistor to turn on in response to a rising transition of a signal on the wire and then turn off after a first period of time, wherein the first transistor drives the output of the circuit to a high state to assist in the rising transition;

second circuitry coupled to the input and to the output, wherein the second circuitry causes a second transistor to turn on in response to a falling transition of a signal on the wire and then turn off after a second period of time, wherein the second transistor drives the output to a low state to assist in the falling transition; and third circuitry coupled between the input and the output, wherein the third circuitry maintains the high state at the output from the rising transition until the falling transition after the first transistor turns off, wherein the third circuitry also maintains the low state from the falling transition until a next rising transition after the second transistor turns off, and wherein further the third circuitry resets the first circuitry in response to the rising transition and resets the second circuitry in response to the falling transition.

20. The circuit of claim 19 wherein the input is connected to the output and wherein the input and output are coupled to the wire in a lookaside configuration.

21. The circuit of claim 19 wherein the input and the output are coupled to the wire in a feed-through configuration.

22. The circuit of claim 19 wherein the first circuitry comprises:

a NAND gate coupled to the wire; and a delay chain coupled to the NAND gate.

23. The circuit of claim 19 wherein the first transistor is a p-type device.

24. The circuit of claim 19 wherein the second circuitry comprises:

a NOR gate coupled to the wire; and a delay chain coupled to the NOR gate.

25. The circuit of claim 19 wherein the second transistor is an n- type device.

* * * * *